United States Patent
Choi et al.

(10) Patent No.: US 8,324,071 B2
(45) Date of Patent: Dec. 4, 2012

(54) METHOD FOR FORMING SILICON FILM, METHOD FOR FORMING PN JUNCTION AND PN JUNCTION FORMED USING THE SAME

(75) Inventors: Junhee Choi, Seongnam-si (KR); Andrei Zoulkarneev, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 433 days.

(21) Appl. No.: 12/458,665

(22) Filed: Jul. 20, 2009

(65) Prior Publication Data

US 2010/0187662 A1   Jul. 29, 2010

(30) Foreign Application Priority Data

Jan. 23, 2009   (KR) .................. 10-2009-0006118

(51) Int. Cl.
- *H01L 21/76* (2006.01)
- *H01L 21/20* (2006.01)
- *H01L 21/36* (2006.01)
- *H01L 21/44* (2006.01)

(52) U.S. Cl. ... 438/405; 438/478; 438/605; 257/E21.54; 257/E21.135; 257/E29.005

(58) Field of Classification Search ............... 438/405, 438/478, 680; 257/E21.54, E21.135, E29.005
See application file for complete search history.

(56) References Cited

U.S. PATENT DOCUMENTS

| | | | |
|---|---|---|---|
| 6,896,780 B2 * | 5/2005 | Yang et al. | 204/408 |
| 7,329,361 B2 * | 2/2008 | Guha et al. | 216/2 |
| 2009/0020760 A1 * | 1/2009 | Choi et al. | 257/66 |
| 2009/0223557 A1 * | 9/2009 | Park et al. | 136/255 |

FOREIGN PATENT DOCUMENTS

| | | |
|---|---|---|
| JP | 6-204142 | 7/1994 |
| JP | 7-106611 | 4/1995 |
| JP | 11-150283 | 6/1999 |
| JP | 2001-068422 | 3/2001 |

OTHER PUBLICATIONS

An English language abstract of Japanese Publication No. JP 1994-204142, published Jul. 22, 1994.
An English language abstract of Japanese Publication No. JP 1995-106611, published Apr. 21, 1995.
An English language abstract of Japanese Publication No. JP 1999-150283, published Jun. 2, 1999.

* cited by examiner

*Primary Examiner* — David S Blum
(74) *Attorney, Agent, or Firm* — Harness, Dickey & Pierce, P.L.C.

(57) ABSTRACT

A method for forming a silicon film may be performed using a microheater including a substrate and a metal pattern spaced apart from the substrate. The silicon film may be formed on the metal pattern by applying a voltage to the metal pattern of the microheater to heat the metal pattern and by exposing the microheater to a source gas containing silicon. The silicon film may be made of polycrystalline silicon. A method for forming a pn junction may be performed using a microheater including a substrate, a conductive layer on the substrate, and a metal pattern spaced apart from the substrate. The pn junction may be formed between the metal pattern and the conductive layer by applying a voltage to the metal pattern of the microheater to heat the metal pattern. The pn junction may be made of polycrystalline silicon.

18 Claims, 13 Drawing Sheets

METHOD FOR FORMING SILICON FILM, METHOD FOR FORMING PN JUNCTION AND PN JUNCTION FORMED USING THE SAME

CROSS-REFERENCE TO RELATED APPLICATION

This application claims priority under 35 U.S.C. §119 to Korean Patent Application No. 10-2009-0006118, filed on Jan. 23, 2009, in the Korean Intellectual Property Office (KIPO), the entire contents of which are herein incorporated by reference.

BACKGROUND

1. Field

Embodiments of the present invention relate to a method for forming a silicon film, a method for forming a pn junction, and a pn junction formed using the same.

2. Description of the Related Art

A silicon structure can be classified into amorphous silicon, single crystal silicon, and polycrystalline silicon depending on the crystal structure. Methods for forming polycrystalline silicon include a crystallization method and a direct growth method.

In the crystallization method, after forming amorphous silicon, amorphous silicon is changed into polycrystalline silicon by excimer laser annealing (ELA) or rapid thermal annealing (RTA).

In the direct growth method, polycrystalline silicon is directly grown on a substrate by a chemical vapor deposition (CVD) method. Polycrystalline silicon may be grown on a glass substrate using a thermal CVD method, a hot filament CVD method, or a very high frequency CVD method.

SUMMARY

Embodiments of the present invention provide a method for forming a silicon film made of polycrystalline silicon using a microheater, a method for forming a pn junction, and a pn junction formed using the same.

According to an embodiment of the present invention, a method for forming a silicon film may include providing a microheater including a substrate and a metal pattern spaced apart from the substrate; applying a voltage to the metal pattern to heat the metal pattern; and exposing the microheater to a source gas containing silicon to form a silicon film on the metal pattern.

According to an embodiment of the present invention, a method for forming a pn junction may include providing a microheater including a substrate, a conductive layer on the substrate, and a metal pattern spaced apart from the substrate; and forming a pn junction between the metal pattern and the conductive layer by applying a voltage to the metal pattern to heat the metal pattern.

According to an embodiment of the present invention, a pn junction may include a microheater including a substrate, a conductive layer on the substrate, and a metal pattern spaced apart from the substrate; and a first doped layer and a second doped layer between the conductive layer and the metal pattern. At least one of the first doped layer and the second doped layer may be grown on the metal pattern.

BRIEF DESCRIPTION OF THE DRAWINGS

Embodiments of the present invention will be more clearly understood from the following detailed description taken in conjunction with the accompanying drawings. FIGS. 1-8E represent non-limiting, embodiments of the present invention as described herein.

FIG. 1 is a perspective view illustrating a microheater according to an embodiment of the present invention;

FIGS. 8A to 8E are sectional views illustrating a method for forming a pn junction according to an embodiment of the present invention.

Figure 1:
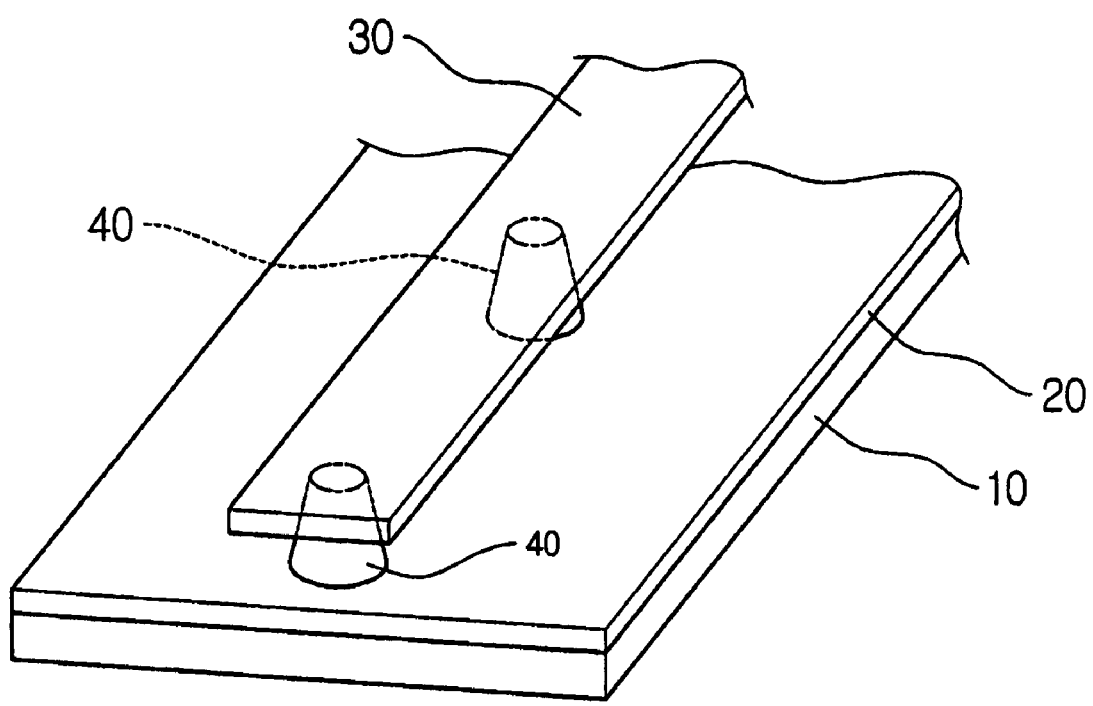

It should be noted that these Figures are intended to illustrate the general characteristics of methods, structure and/or materials utilized in certain embodiments and to supplement the written description provided below. These drawings are not, however, to scale and may not precisely reflect the precise structural or performance characteristics of any given embodiment, and should not be interpreted as defining or limiting the range of values or properties encompassed by embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Embodiments now will be described more fully hereinafter with reference to the accompanying drawings, in which embodiments are shown. This disclosure may, however, be embodied in many different forms and should not be construed as limited to embodiments set forth therein. Rather, these embodiments are provided so that this disclosure will be thorough and complete, and will fully convey the scope of this disclosure to those skilled in the art. In the description, details of well-known features and techniques may be omitted to avoid unnecessarily obscuring the presented embodiments.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. Furthermore, the use of the terms a, an, etc. does not denote a limitation of quantity, but rather denotes the presence of at least one of the referenced item. The use of the terms "first", "second", and the like does not imply any particular order, but they are included to identify individual elements. Moreover, the use of the terms first, second, etc. does not denote any order or importance, but rather the terms first, second, etc. are used to distinguish one element from another. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, like reference numerals in the drawings denote like elements. The shape, size and regions, and the like, of the drawing may be exaggerated for clarity.

FIG. 1 is a perspective view illustrating a microheater according to an embodiment of the present invention. Referring to FIG. 1, the microheater may include a substrate 10 and a metal pattern 30 spaced apart from the substrate 10. The substrate 10 may be made of a glass material. When the substrate 10 is made of the glass material, radiant heat (for example, visible rays or infrared rays) may penetrate the substrate 10. Further, the substrate 10 may be manufactured to have a relatively large area.

The metal pattern 30 may be formed above the substrate 10 to be spaced apart from the substrate 10. The metal pattern 30 may be linear to extend on the substrate 10 in a direction. However, the shape of the metal pattern 30 is not limited to the above but may be different polygons or closed surfaces. The metal pattern 30 may be made of Mo, W, or SiC. When a voltage is applied to the metal pattern 30, the metal pattern 30 may emit light and heat.

As used herein, each of the substrate 10 and the metal pattern 30 may include at least one material layer (not shown) formed on the surface thereof. For example, formation of a silicon film on the substrate 10 may mean that the silicon film is formed on at least one material layer previously formed on the substrate 10.

At least one supporting unit 40 positioned between the metal pattern 30 and the substrate 10 may support the metal pattern 30 with the metal pattern 30 spaced apart from the substrate 10. The supporting unit 40 may be made of a material having a relatively small heat conduction rate in order to prevent or reduce the loss of heat generated by the metal pattern 30. For example, the supporting unit 40 may be formed of an insulating material, e.g., silicon oxide ($SiO_x$) or silicon nitride (for example, $Si_3N_4$).

A conductive layer 20 may be formed on the substrate 10. The metal pattern 30 and the conductive layer 20 may be used as an upper electrode and a lower electrode, respectively, when the microheater is applied to a device. The conductive layer 20 may be made of a transparent conductive material. For example, the conductive layer 20 may be made of indium tin oxide (ITO), zinc oxide, or other suitable materials.

Figure 2A:
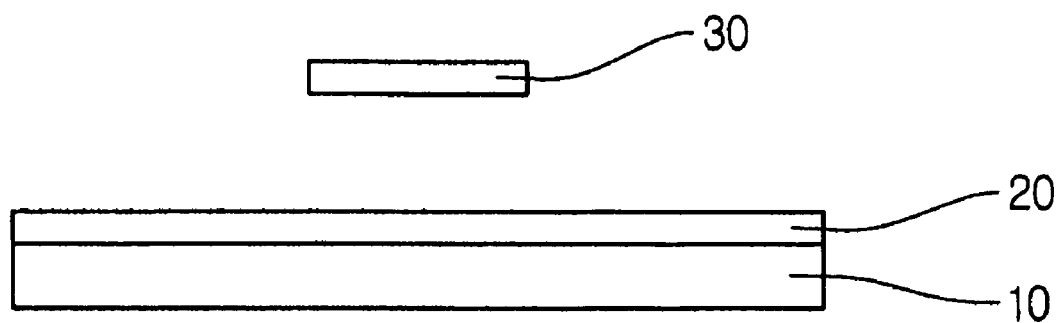
FIGS. 2A to 2C are sectional views illustrating a method for forming a silicon film according to an embodiment of the present invention.
Figure 2B:
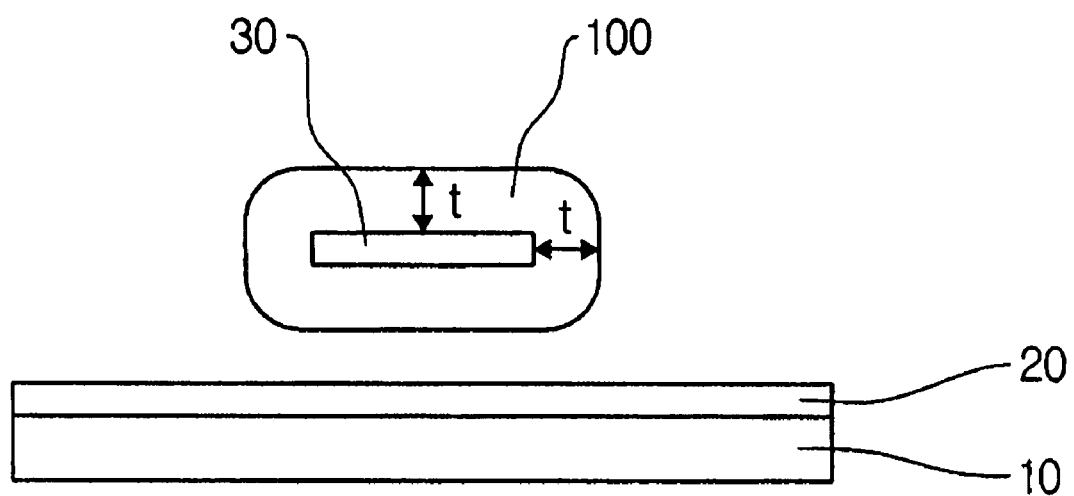
Figure 2C:
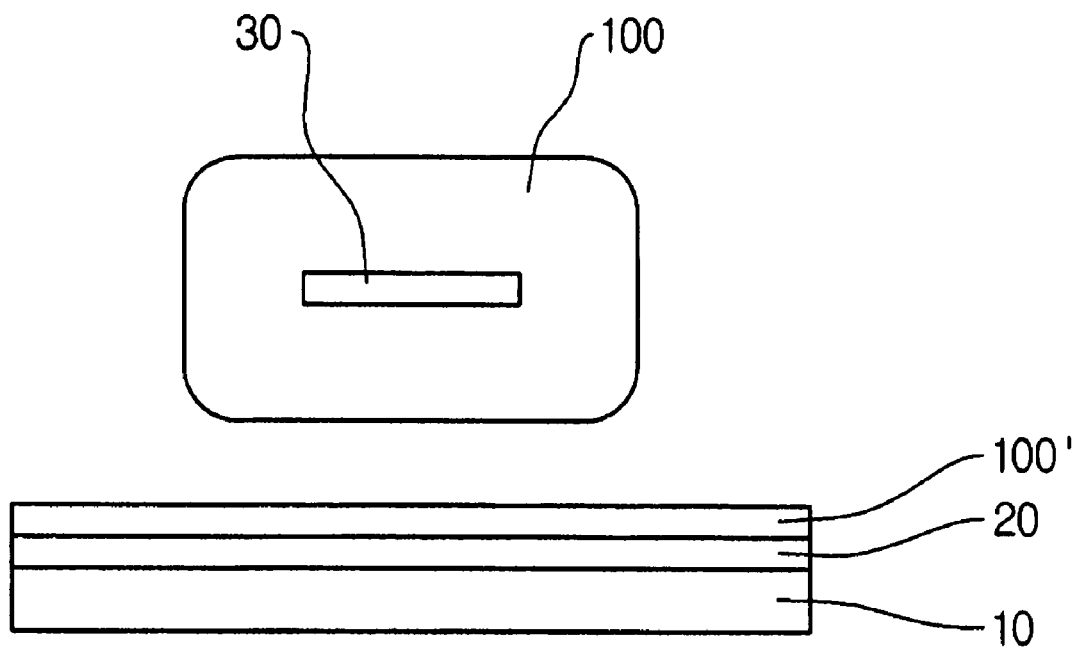

FIGS. 2A to 2C are sectional views illustrating a method for forming a silicon film according to an embodiment of the present invention. Referring to FIG. 2A, a microheater including a substrate 10 and a metal pattern 30 spaced apart from the substrate 10 may be provided. A conductive layer 20 may be formed on the substrate 10.

Referring to FIG. 2B, a silicon film 100 may be formed on the metal pattern 30. The silicon film 100 may be formed by applying a voltage to the metal pattern 30 to heat the metal pattern 30 and by exposing the heated metal pattern 30 to a source gas. For example, the microheater including the metal pattern 30 may be positioned in a vacuum chamber and the source gas may be injected into the chamber so that the metal pattern 30 may be exposed to the source gas. The source gas may be a material including silicon, e.g., silane ($SiH_4$).

The heating temperature of the metal pattern 30 may be equal to or above a first temperature. As used herein, the first temperature may refer to the minimum temperature at which the metal pattern 30 is heated so that the silicon film 100 may be grown on the metal pattern 30. For example, the first temperature may be about 600° C.

When the source gas contacts the surface of the metal pattern 30 heated at a temperature equal to or above the first temperature, the source gas may be decomposed on the surface of the metal pattern 30 so that the silicon film 100 may be grown on the metal pattern 30. The silicon film 100 may be formed to an equal thickness t in all directions on the surface of the metal pattern 30.

For example, when the metal pattern 30 is heated at a temperature of about 750° C. under a pressure of about 0.75 Torr using $SiH_4$ of about 100 sccm as the source gas, the silicon film 100 may be grown on the metal pattern 30 at a speed of about 3 μm/min.

On the other hand, the silicon film 100 may be made of polycrystalline silicon. As used herein, polycrystalline silicon may mean an arbitrary silicon structure consisting of grains having a size no less than a predetermined or given size, including microcrystalline silicon. For example, the silicon film 100 may consist of grains having a size no less than about 0.1 μm.

Because the silicon film 100 is formed on the surface of the metal pattern 30, even when a substrate made of glass is used, the silicon film 100 may be formed at a relatively high temperature. Therefore, the silicon film 100 consisting grains having a relatively large size may be obtained.

The silicon film 100 on the metal pattern 30 may contact the conductive layer 20. When the silicon film 100 is applied to a device, the metal pattern 30 and the conductive layer 20 may be used as an upper electrode and a lower electrode for applying power to the silicon film 100, respectively.

Referring to FIG. 2c, according to an embodiment of the present invention, a silicon film 100' may be formed on the substrate 10 at the same time as the silicon film 100 is formed on the surface of the metal pattern 30.

The heating temperature of the metal pattern 30 may be equal to or above a second temperature. As used herein, the second temperature may refer to the minimum temperature at which the metal pattern 30 is exposed to the source gas so that a layer made of silicon may be formed on the substrate 10 as well as on the metal pattern 30. The second temperature may be higher than the first temperature. For example, the second temperature may be about 900° C.

That is, when the heating temperature of the metal pattern 30 is between the first temperature and the second temperature, as described above with reference to FIG. 2B, the silicon film 100 may be formed only on the metal pattern 30.

However, when the metal pattern 30 is heated at a temperature equal to or above the second temperature, the source gas may be decomposed on the surface of the metal pattern 30, so that the silicon film 100 may be formed on the metal pattern 30 and, at the same time, the silicon film 100' may be formed on the substrate 10 by the silicon molecules that constitute the source gas. In an embodiment of the present invention, whereas the silicon film 100 on the metal pattern 30 is made of polycrystalline silicon, the silicon film 100' on the substrate 10 may be made of amorphous silicon.

Figure 3A:
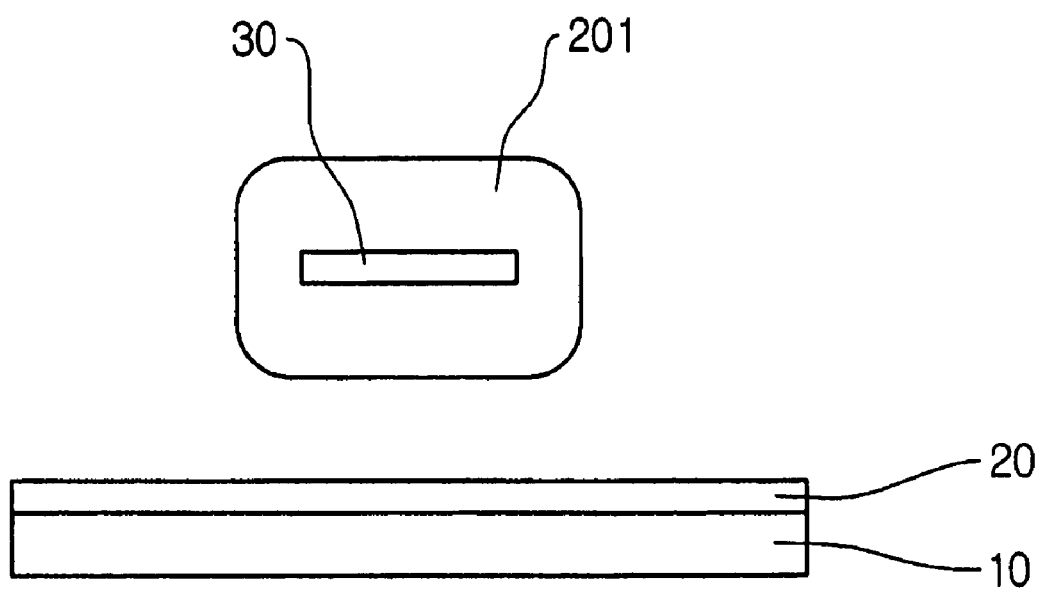
FIGS. 3A to 3C are sectional views illustrating a method for forming a pn junction according to an embodiment of the present invention.
Figure 3B:
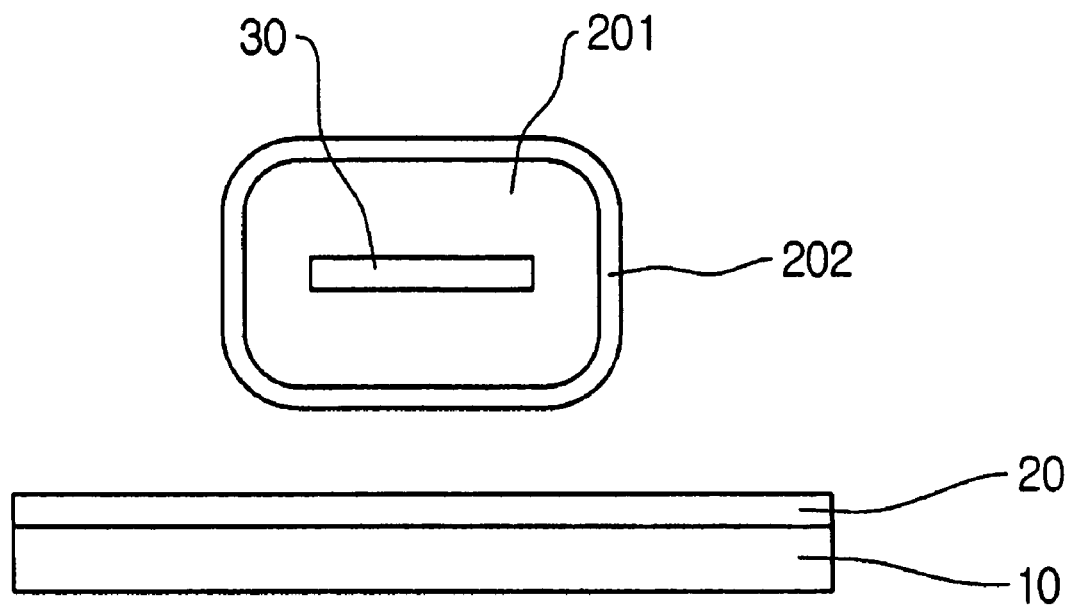
Figure 3C:
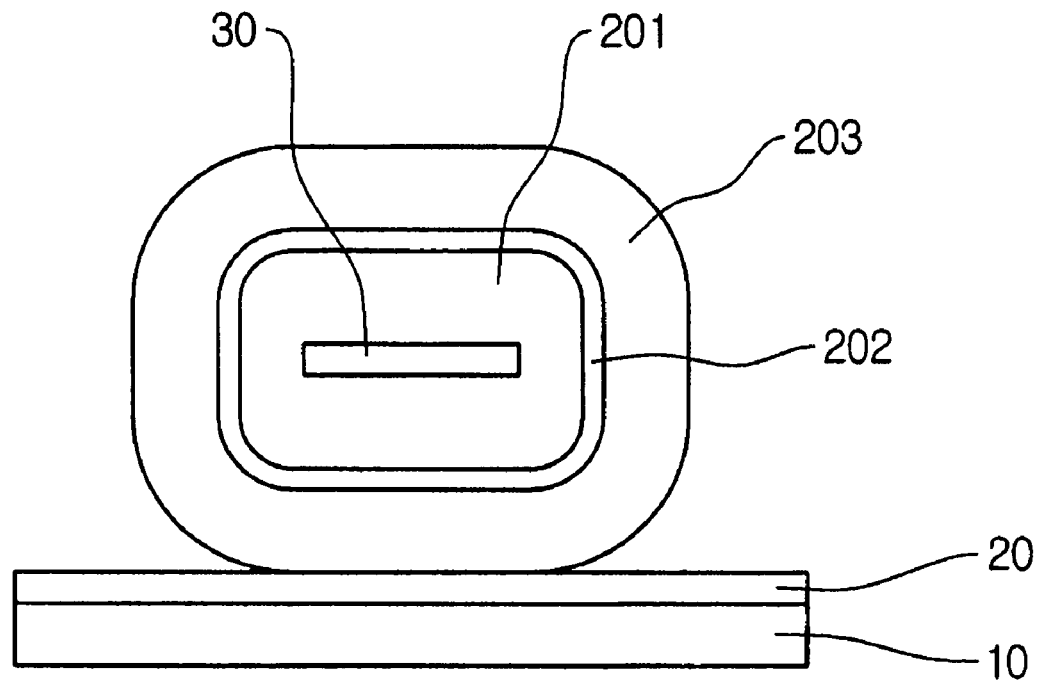

FIGS. 3A to 3C are sectional views illustrating a method for forming a pn junction according to an embodiment of the present invention. As used herein, the pn junction may mean various structures in which pn junction characteristics are used, e.g., p/i (intrinsic Si)/n, n/p/n, p/n/p/n, and p/i/n/p/i/n, as well as a p/n or n/p structure consisting of one p-type doped layer and one n-type doped layer.

Referring to FIG. 3A, the microheater including the substrate 10, the conductive layer 20 on the substrate, and the metal pattern 30 spaced apart from the substrate 10 is provided. A first doped layer 201 may be grown on the metal pattern 30. The first doped layer 201 may be made of n-type or p-type doped silicon.

The first doped layer 201 may be formed by applying a voltage to the metal pattern 30 to heat the metal pattern 30 and by exposing the heated metal pattern 30 to the source gas and a first doping gas. The metal pattern 30 may be heated at a temperature no less than the first temperature.

The source gas may be a material including silicon, e.g., $SiH_4$. The first doping gas may be a material for doping the first doped layer 201 as p-type or n-type. For example, the first doping gas may be phosphine ($PH_3$) when the first doped layer 201 is an n-type doped layer.

Referring to FIG. 3B, an intrinsic layer 202 may be grown on the first doped layer 201. The intrinsic layer 202 may be formed by exposing the metal pattern 30 on which the first doped layer 201 is formed to the source gas. The metal pattern 30 may be maintained at a temperature no less than the first temperature. Because the intrinsic layer 202 is formed using only the source gas without the doping gas, the intrinsic layer 202 may be made of intrinsic silicon.

Referring to FIG. 3C, a second doped layer 203 may be grown on the metal pattern 30 on which the intrinsic layer 202 is formed. The second doped layer 203 may be grown until the second doped layer 203 contacts the conductive layer 20 on the substrate 10. The second doped layer 203 may be formed by exposing the heated metal pattern 30 to the source gas and a second doping gas. The second doping gas may be a material for doping the second doped layer 203 as p-type or n-type. For example, the second doping gas may be diborane ($B_2H_6$) when the second doped layer 203 is a p-type doped layer.

The first doped layer 201 and the second doped layer 203 may be doped as different types. As a result, a pn junction having a p/i/n or n/i/p structure consisting of the first doped layer 201, the intrinsic layer 202, and the second doped layer 203 may be formed.

According to another example embodiment of the present invention, formation of the intrinsic layer 202 described above with reference to FIG. 3B may be omitted. In embodiments, because the second doped layer 203 is directly grown on the first doped layer 201, a pn junction of a p/n or n/p structure may be formed.

According to the above-described method for forming the pn junction, because the first doped layer 201 and the second doped layer 203 are formed on the metal pattern 30 at a relatively high temperature, the first and second doped layer 201, 203 may be made of polycrystalline silicon. Therefore, a relatively higher quality pn junction may be obtained as compared to when the pn junction is formed on a glass substrate. Further, the pn junction may be formed at a relatively high speed. The pn junction may be used for a device, e.g., a light emitting diode (LED), a solar cell, and a photodiode.

Figure 4A:
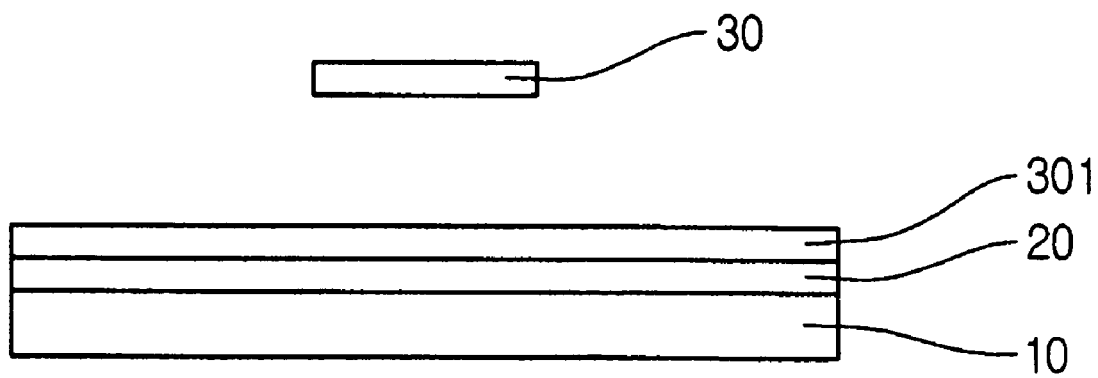
FIGS. 4A to 4C are sectional views illustrating a method for forming a pn junction according to an embodiment of the present invention.
Figure 4B:
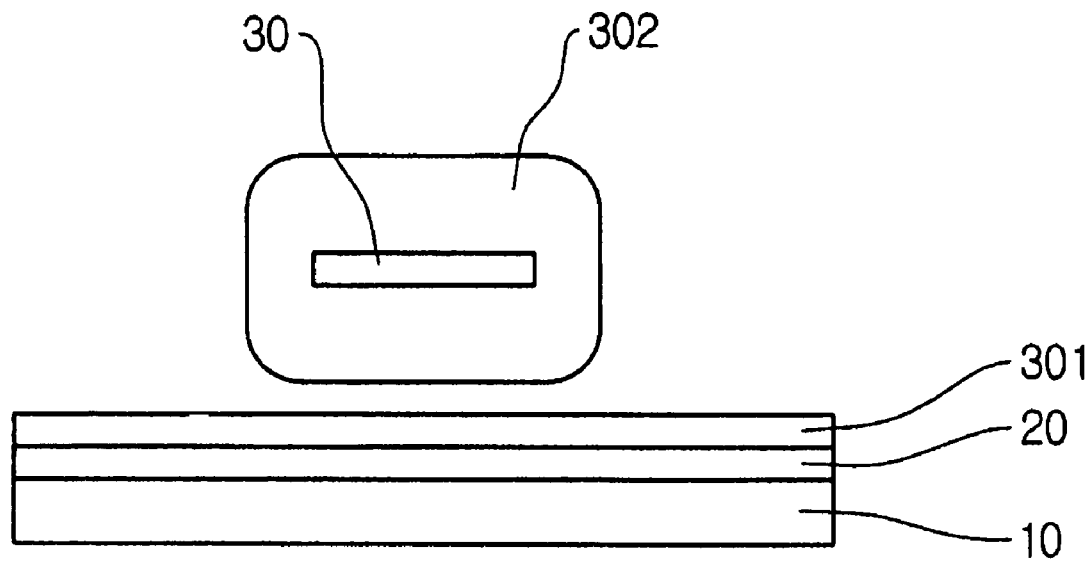
Figure 4C:
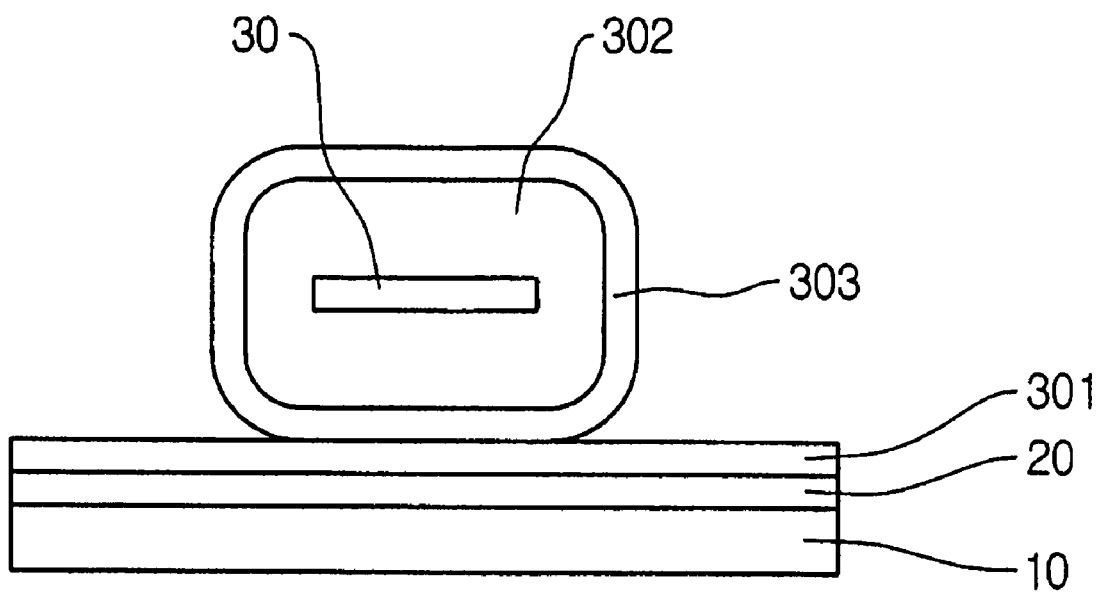

FIGS. 4A to 4C are sectional views illustrating a method for forming a pn junction according to an embodiment of the present invention. Referring to FIG. 4A, the microheater including the substrate 10, the conductive layer 20 on the substrate 10, and the metal pattern 30 spaced apart from the substrate 10 may be provided and a first doped layer 301 may be formed on the substrate 10. The first doped layer 301 may be made of amorphous silicon. The first doped layer 301 may be formed by a chemical vapor deposition (CVD) method or other suitable methods. For example, the first doped layer 301 may be formed by a plasma enhanced CVD (PECVD) method.

Referring to FIG. 4B, a second doped layer 302 may be grown on the metal pattern 30. The second doped layer 302 may be formed by applying a voltage to the metal pattern 30 to heat the metal pattern 30 and by exposing the heated metal pattern 30 to the source gas and a second doping gas. The second doped layer 302 may be doped to be of a different type from the first doped layer 301.

Referring to FIG. 4C, an intrinsic layer 303 may be grown on the second doped layer 302. The intrinsic layer 303 may be formed by exposing the metal pattern 30 on which the second doped layer 302 is formed to the source gas. The intrinsic layer 303 may be grown until the intrinsic layer 303 contacts the first doped layer 301 on the substrate 10.

As a result, a pn junction of a p/i/n or n/i/p structure consisting of the first doped layer 301, the intrinsic layer 303, and the second doped layer 302 may be formed. The first doped layer 301 may be made of amorphous silicon and the intrinsic layer 303 and the second doped layer 302 may be made of polycrystalline silicon.

On the other hand, according to another embodiment of the present invention, referring to FIG. 4C, formation of the above-described intrinsic layer 302 may be omitted and the second doped layer 302 may be grown on the metal pattern 30 to contact the first doped layer 301 so that the pn junction of the n/p or p/n structure may be formed.

Figure 5A:
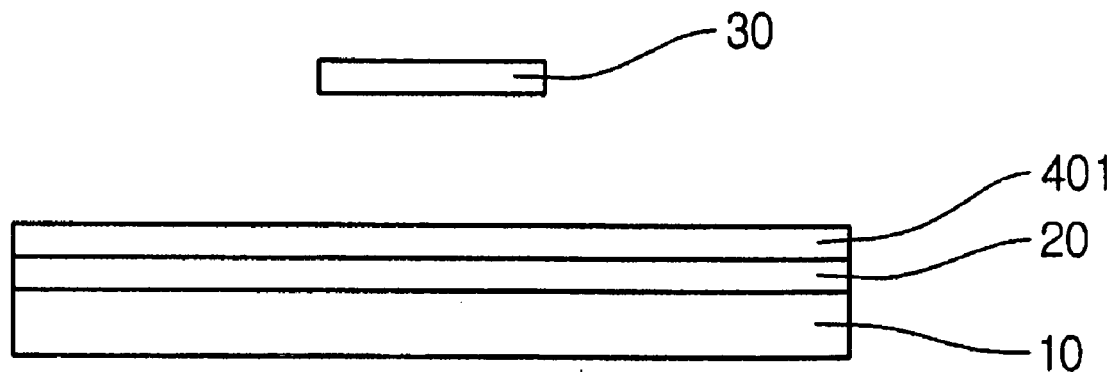
FIGS. 5A to 5C are sectional views illustrating a method for forming a pn junction according to an embodiment of the present invention.
Figure 5B:
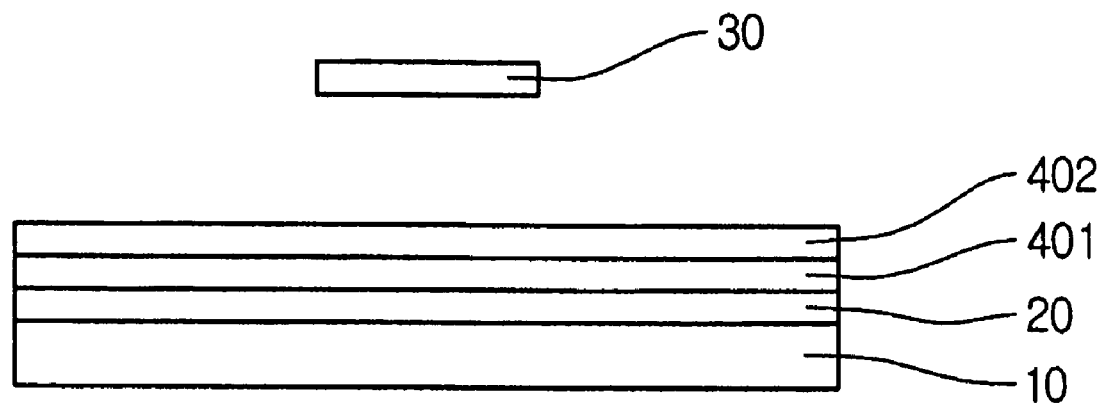
Figure 5C:
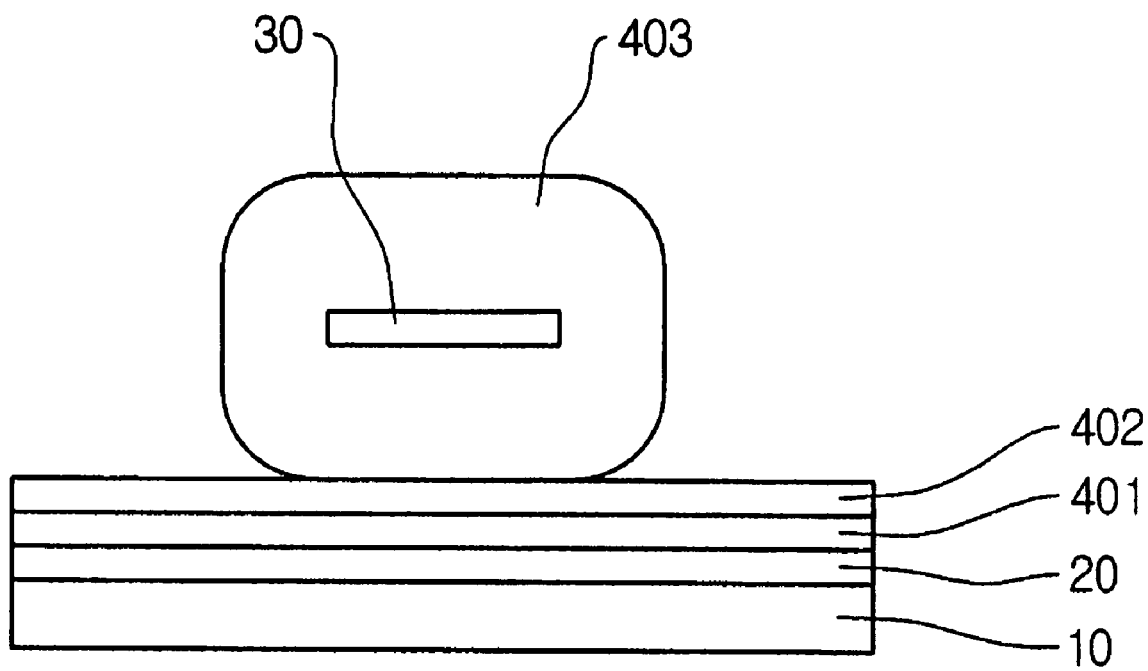

FIGS. 5A to 5C are sectional views illustrating a method for forming a pn junction according to an embodiment of the present invention. Referring to FIG. 5A, the microheater including the substrate 10, the conductive layer 20 on the substrate 10, and the metal pattern 30 spaced apart from the substrate 10 may be provided and a first doped layer 401 may be formed on the substrate 10. The first doped layer 401 may be made of n-type or p-type doped amorphous silicon.

Referring to FIG. 5B, an intrinsic layer 402 may be grown on the substrate 10 on which the first doped layer 401 is formed. The first doped layer 401 and the intrinsic layer 402 may be formed by a CVD method or other suitable methods.

Referring to FIG. 5C, a second doped layer 403 may be grown on the metal pattern 30. The second doped layer 403 may be formed by applying a voltage to the metal pattern 30 to heat the metal pattern 30 and by exposing the heated metal pattern 30 to the source gas and the second doping gas. The metal pattern 30 may be heated at a temperature no less than the first temperature. The second doped layer 403 may be grown until the second doped layer 403 contacts the intrinsic layer 402 on the substrate 10.

The second doped layer 403 may be doped to be of a different type from the first doped layer 401. As a result, a pn junction of a p/i/n or n/i/p structure consisting of the first doped layer 401, the intrinsic layer 402, and the second doped layer 403 may be formed. The first doped layer 401 and the intrinsic layer 402 may be made of amorphous silicon and the second doped layer 403 may be made of polycrystalline silicon.

According to the methods for forming a pn junction described above with reference to FIGS. 4 and 5, the layer made of amorphous silicon is combined with the layer made of polycrystalline silicon to form the pn junction.

Figure 6A:
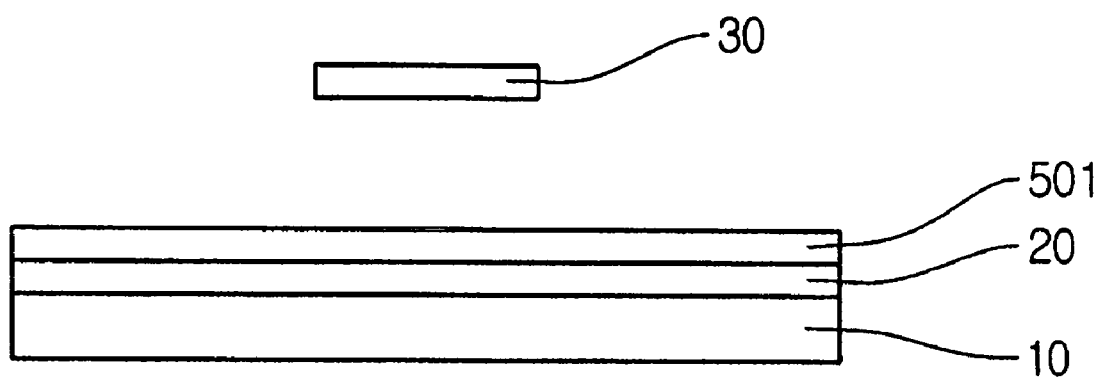
FIGS. 6A to 6C are sectional views illustrating a method for forming a pn junction according to an embodiment of the present invention.
Figure 6B:
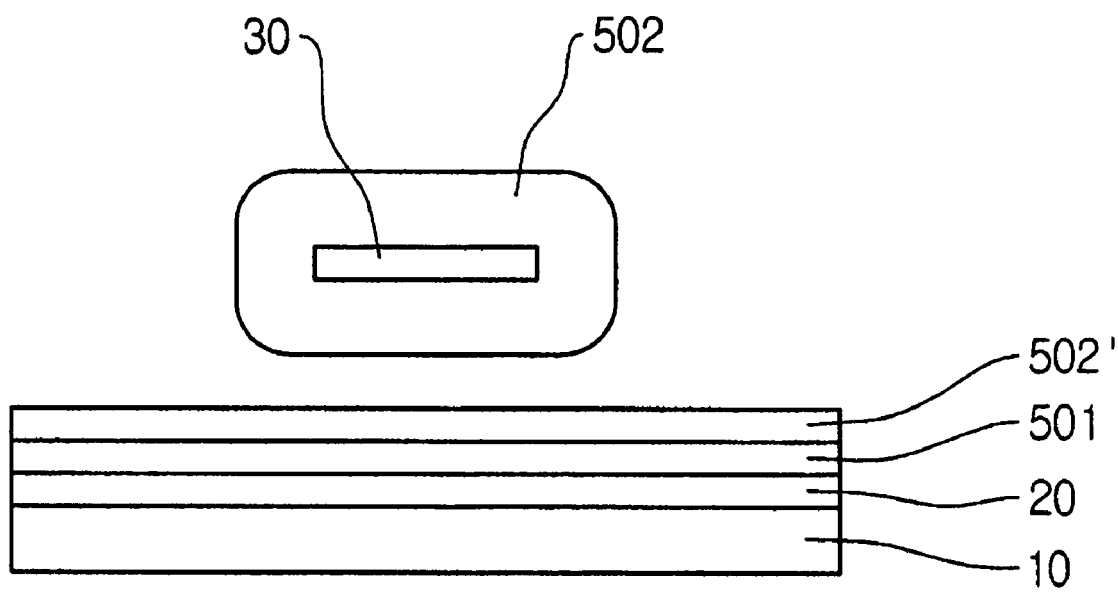
Figure 6C:
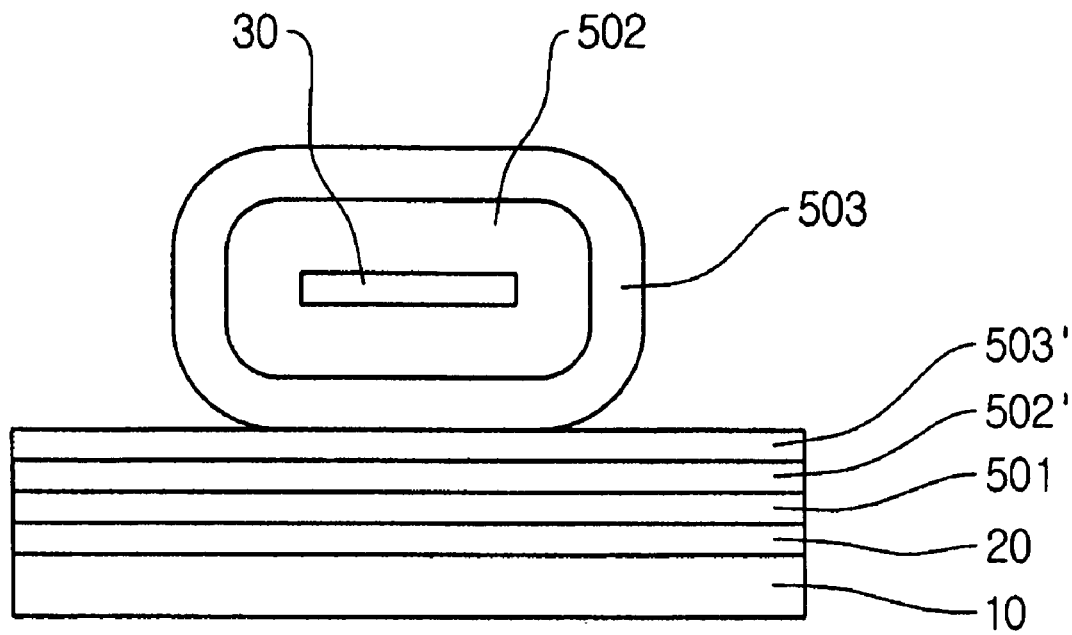

FIGS. 6A to 6C are sectional views illustrating a method for forming a pn junction according to an embodiment of the present invention. Referring to FIG. 6A, the microheater including the substrate 10, the conductive layer 20 on the substrate 10, and the metal pattern 30 spaced apart from the substrate 10 may be provided. A first doped layer 501 may be formed on the substrate 10. The first doped layer 501 may be made of n-type or p-type doped amorphous silicon. The first doped layer 501 may be formed by a CVD method or other suitable methods.

Referring to FIG. 6B, a second doped layer 502 may be formed on the metal pattern 30. Meanwhile, when the metal pattern 30 is heated at a temperature no less than the second temperature, a layer made of polycrystalline silicon may be formed on the metal pattern 30 and, at the same time, a layer made of amorphous silicon may be formed on the substrate 10. Therefore, by controlling the temperature of the metal pattern 30 to be between the first temperature and the second temperature or to be no less than the second temperature, a silicon film may be selectively formed on the substrate 10.

Referring to FIG. 6B, the metal pattern 30 may be heated at a temperature no less than the second temperature so that the second doped layer 502 may be formed on the metal pattern 30 and, at the same time, a second doped layer 502' may be formed on the substrate 10. Whereas the second doped layer 502 on the metal pattern 30 is made of polycrystalline silicon, the second doped layer 502' on the substrate 10 may be made of amorphous silicon.

Referring to FIG. 6C, first doped layers 503 and 503' may be formed on the substrate 10 and the metal pattern 30, respectively. The first doped layers 503 and 503' may be formed by exposing the heated metal pattern 30 to the source gas and the first doping gas. The metal pattern 30 may be maintained at a temperature no less than the second temperature. The first doped layers 503 and 503' may be grown until the first doped layers 503 and 503' contact each other.

On the other hand, according to another embodiment of the present invention, after forming the second doped layers 502 and 502', the temperature of the metal pattern 30 may be controlled to be between the first temperature and the second temperature so that the first doped layer 503 may be grown only on the metal pattern 30. In embodiments, the grown first doped layer 503 may contact the second doped layer 502' on the substrate 10.

Through the processes described above with reference to FIGS. 6A to 6C, a pn junction of a p/n-p/n or n/p-n/p structure consisting of the first doped layer 501, the second doped layer 502', the first doped layer 503, and the second doped layer 502 may be formed. Whereas the first doped layer 501 and the second doped layer 502' are made of amorphous silicon, the first doped layer 503 and the second doped layer 502 may be made of polycrystalline silicon. The pn junction of the above structure may be used for manufacturing a tandem solar cell.

Figure 7A:
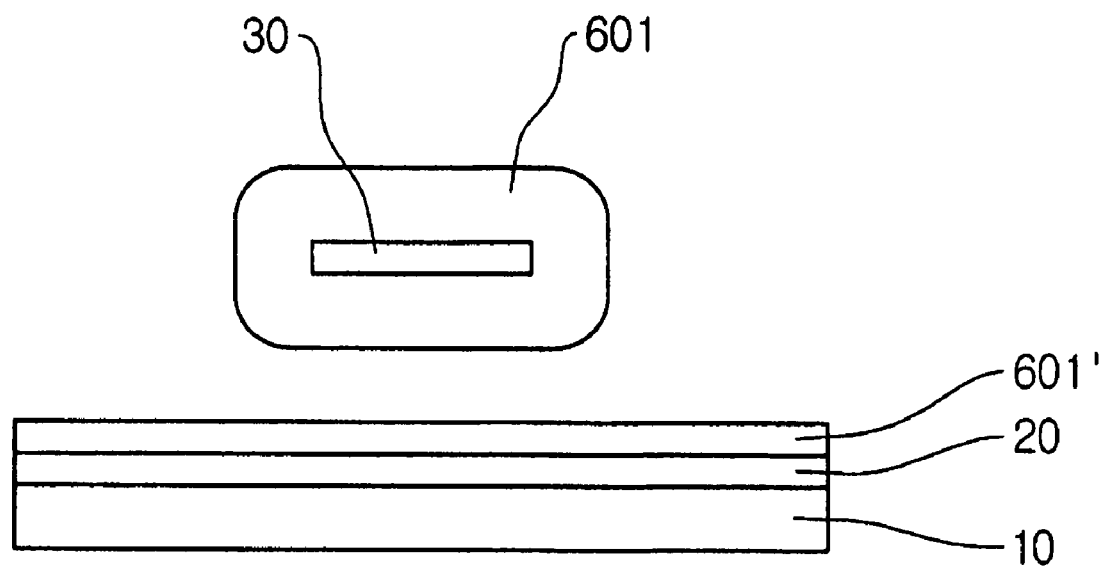
FIGS. 7A to 7C are sectional views illustrating a method for forming a pn junction according to an embodiment of the present invention.
Figure 7B:
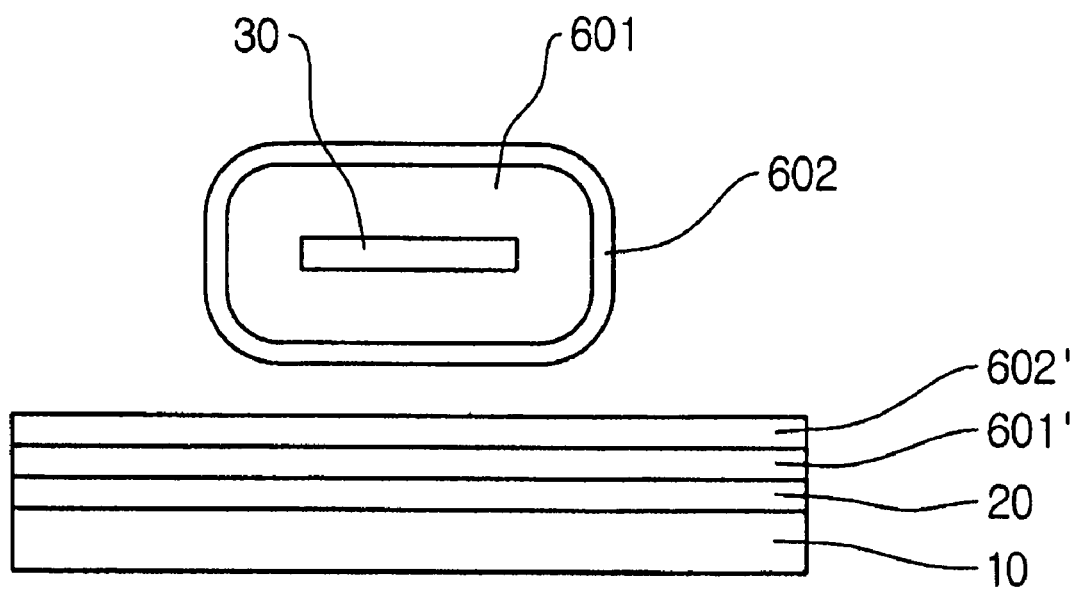
Figure 7C:
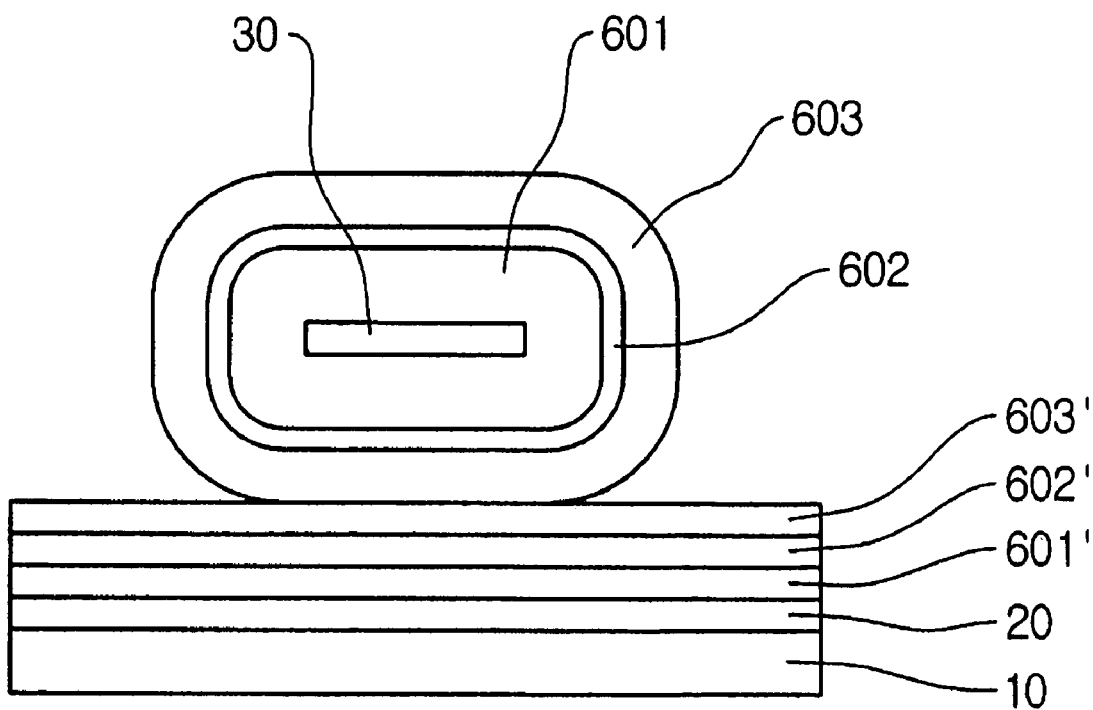

FIGS. 7A to 7C are sectional views illustrating a method for forming a pn junction according to an embodiment of the present invention. Referring to FIG. 7A, the microheater including the substrate 10, the conductive layer 20 on the substrate 10, and the metal pattern 30 spaced apart from the substrate 10 may be provided and first doped layers 601 and 601' may be grown on the substrate 10 and the metal pattern 30, respectively. The heating temperature of the metal pattern 30 may be no less than the second temperature.

Referring to FIG. 7B, intrinsic layers 602 and 602' may be grown on the substrate 10 and the metal pattern 30, respectively. The intrinsic layers 602 and 602' may be formed by exposing the heated metal pattern 30 to the source gas.

Referring to FIG. 7C, second doped layers 603 and 603' may be grown on the substrate 10 and the metal pattern 30, respectively. The second doped layers 603 and 603' may be formed by exposing the heated metal pattern 30 to the source gas and the second doping gas. The second doped layers 603 and 603' may be grown until the second doped layers 603 and 603' contact each other.

Through the processes described above with reference to FIGS. 7B and 7C, the metal pattern 30 may be maintained at a temperature no less than the second temperature. On the other hand, according to another embodiment of the present invention, after forming the intrinsic layers 602 and 602', the heating temperature of the metal pattern 30 may be controlled to be between the first temperature and the second temperature so that the second doped layer 603 may be grown only on the metal pattern 30. In an embodiment of the present invention, the second doped layer 603 may be grown until the second doped layer 603 contacts the intrinsic layer 602' on the substrate 10.

Through the processes described above with reference to FIGS. 7A to 7C, a pn junction of an n/i/p/i/n or p/i/n/i/p structure consisting of the first doped layer 601', the intrinsic layer 602', the second doped layers 603' and 603, the intrinsic layer 602, and the first doped layer 601 may be formed. Whereas the first doped layer 601', the intrinsic layer 602', and the second doped layer 603' are made of amorphous silicon, the second doped layer 603, the intrinsic layer 602, and the first doped layer 601 may be made of polycrystalline silicon.

On the other hand, according to another embodiment of the present invention, formation of the intrinsic layers 602 and 602' described above with reference to FIG. 7B may be omitted. In embodiments, because the second doped layers 603 and 603' are directly grown on the first doped layers 601 and 601', a pn junction of a p/n/p or n/p/n structure may be formed.

Figure 8A:
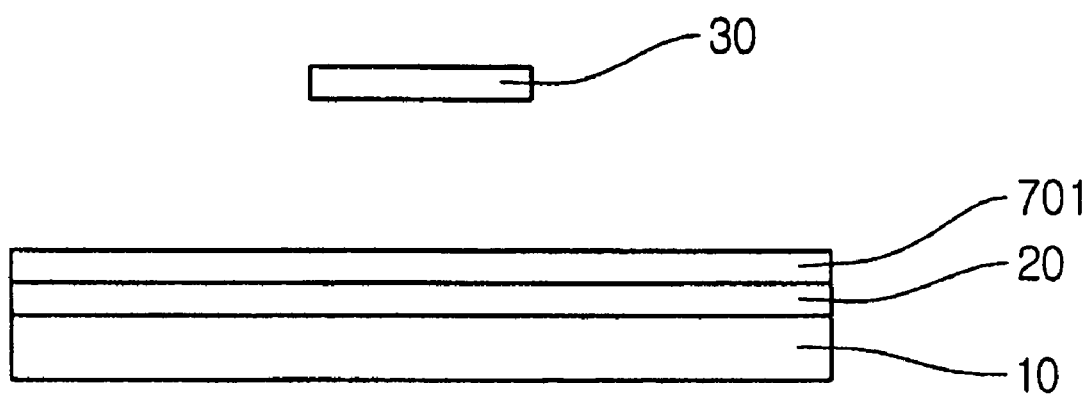

FIGS. 8A to 8E are sectional views illustrating a method for forming a pn junction according to an embodiment of the present invention. Referring to FIG. 8A, the microheater including the substrate 10, the conductive layer 20 on the substrate 10, and the metal pattern 30 spaced apart from the substrate 10 may be provided and a first doped layer 701 may be formed on the substrate 10. The first doped layer 701 may be made of n-type or p-type doped amorphous silicon and may be formed by a CVD method or other suitable methods.

Figure 8B:
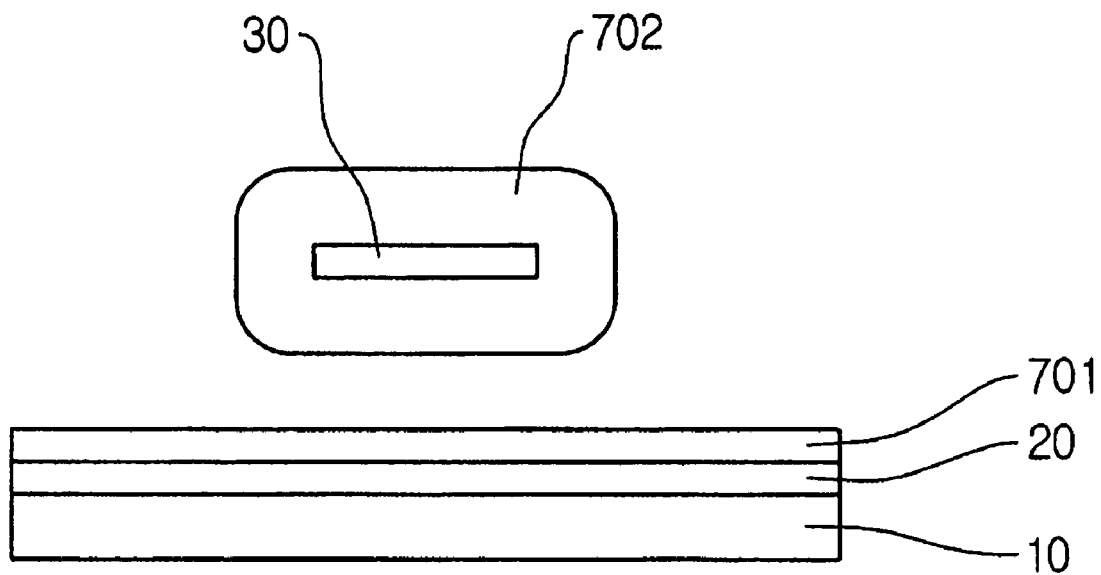

Referring to FIG. 8B, a second doped layer 702 may be grown on the metal pattern 30. The second doped layer 702 may be doped to be of a different type from the first doped layer 701. The second doped layer 702 may be grown by exposing the heated metal pattern 30 to the source gas and the second doping gas. The heating temperature of the metal pattern 30 may be between the first temperature and the second temperature.

Figure 8C:
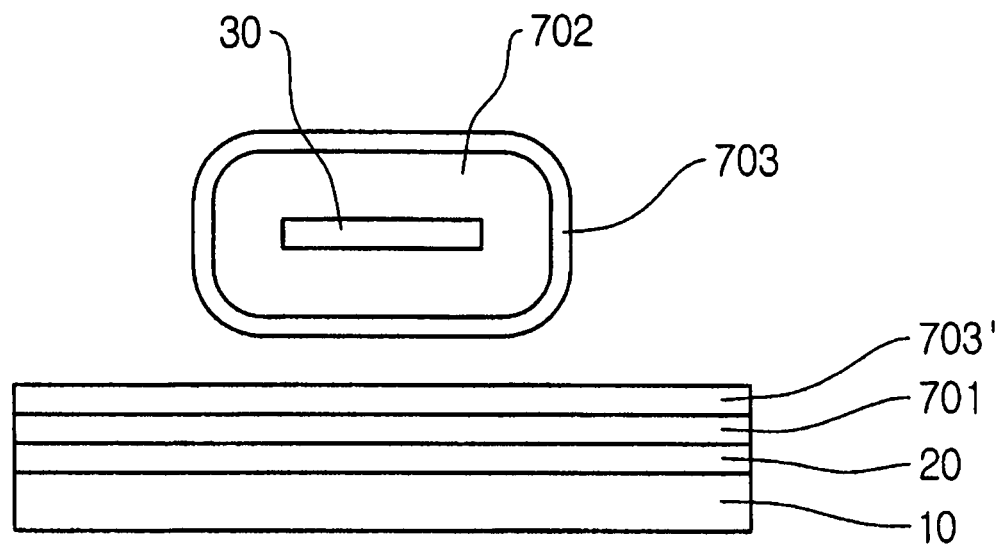

Referring to FIG. 8C, an intrinsic layer 703 may be grown on the metal pattern 30 by heating the metal pattern 30 at a temperature no less than the second temperature and by exposing the heated metal pattern 30 to the source gas. In addition, at the same time, an intrinsic layer 703' may be grown on the substrate 10. The intrinsic layer 703 on the metal pattern 30 may be made of polycrystalline silicon and the intrinsic layer 703' on the substrate 10 may be made of amorphous silicon.

Figure 8D:
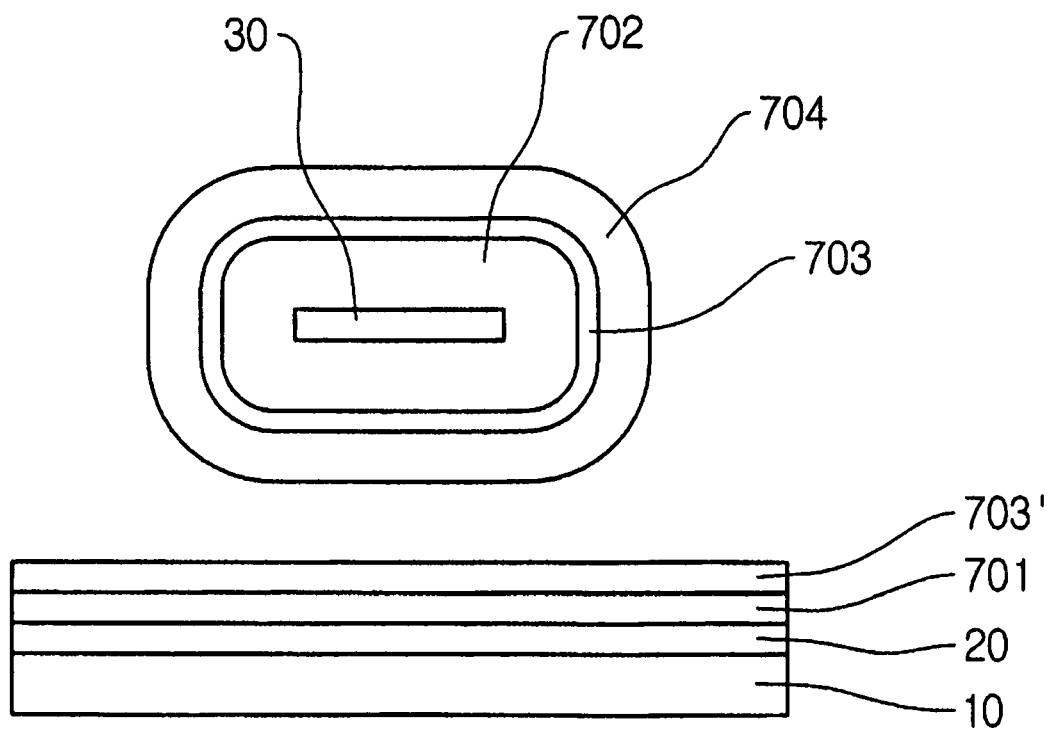

Referring to FIG. 8D, a first doped layer 704 may be grown on the metal pattern 30. The first doped layer 704 may be grown by reducing the voltage applied to the metal pattern 30 to control the heating temperature of the metal pattern 30 to be between the first temperature and the second temperature and by exposing the metal pattern 30 to the source gas and the first doping gas.

Figure 8E:
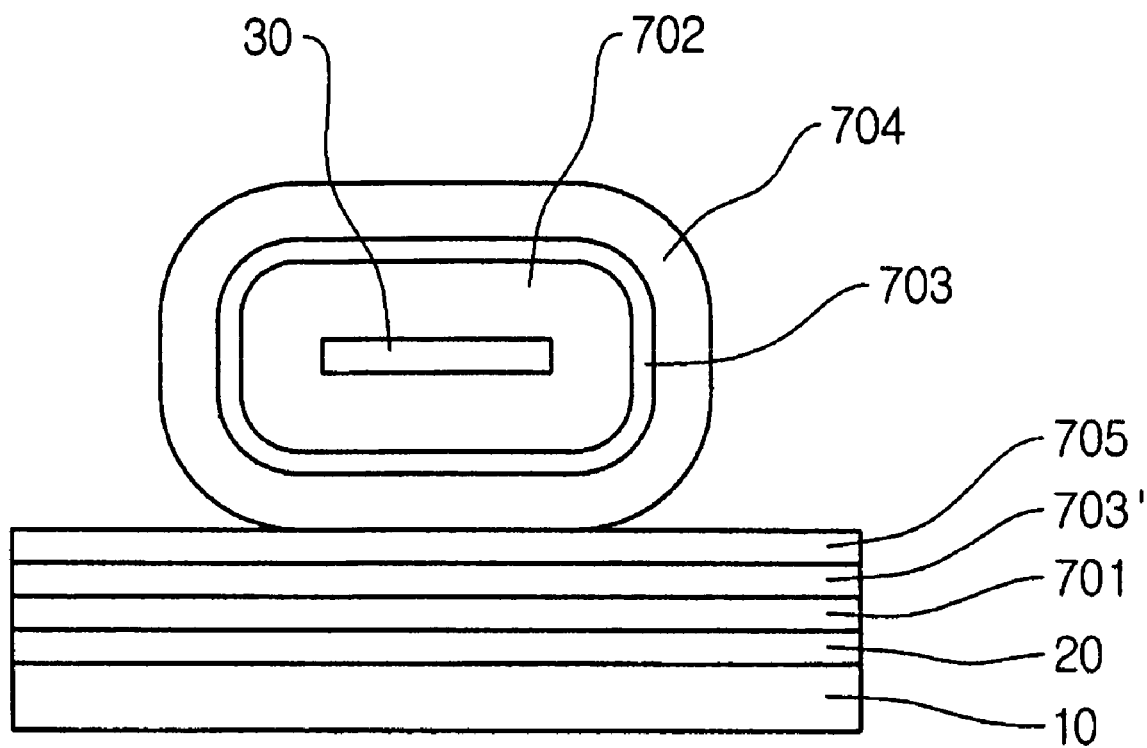

Referring to FIG. 8E, a second doped layer 705 may be formed on the substrate 10. The second doped layer 705 may be made of amorphous silicon and may be formed by a CVD method or other suitable methods. The second doped layer 705 may be grown until the second doped layer 705 contacts the intrinsic layer 703' on the metal pattern 30.

As a result, a pn junction of a p/i/n-p/i/n or n/i/p-n/i/p structure consisting of the first doped layer 701, the intrinsic layer 703', the second doped layer 705, the first doped layer 704, the intrinsic layer 703, and the second doped layer 702 may be formed. The first doped layer 701, the intrinsic layer 703', and the second doped layer 705 may be made of amorphous silicon, and the first doped layer 704, the intrinsic layer 703, and the second doped layer 702 may be made of polycrystalline silicon. The pn junction of the above structure may be used for manufacturing the tandem solar cell.

While embodiments have been shown and described, it will be understood by those skilled in the art that various changes in form and details may be made thereto without departing from the spirit and scope of this disclosure as defined by the appended claims.

In addition, many modifications can be made to adapt a particular situation or material to the teachings of this disclosure without departing from the essential scope thereof. Therefore, it is intended that this disclosure not be limited to the particular embodiments disclosed as the best mode contemplated for carrying out this disclosure, but that this disclosure will include all embodiments falling within the scope of the appended claims.

What is claimed is:

1. A method for forming a silicon film, comprising:
   providing a microheater including a substrate and a metal pattern spaced apart from the substrate;
   applying a voltage to the metal pattern to heat the metal pattern; and
   exposing the microheater to a source gas containing silicon to form a silicon film on the metal pattern.

2. The method according to claim 1, wherein a heating temperature of the metal pattern is no less than a first temperature.

3. The method according to claim 2, wherein the heating temperature of the metal pattern is no less than a second temperature, and forming the silicon film on the metal pattern includes forming an amorphous silicon film on the substrate.

4. The method according to claim 1, wherein the silicon film consists of grains having a size of no less than about 0.1 μm.

5. A method for forming a pn junction, comprising:
   providing a microheater including a substrate, a conductive layer on the substrate, and a metal pattern spaced apart from the substrate; and
   forming a pn junction between the metal pattern and the conductive layer by applying a voltage to the metal pattern to heat the metal pattern.

6. The method according to claim 5, wherein a heating temperature of the metal pattern is no less than a first temperature.

7. The method according to claim 5, wherein forming the pn junction comprises:
   growing a first doped layer on the metal pattern; and
   growing a second doped layer on the metal pattern.

8. The method according to claim 7, wherein forming the pn junction further comprises:
   growing an intrinsic layer between the first doped layer and the second doped layer.

9. The method according to claim 7, wherein
   growing the first doped layer on the metal pattern includes growing the first doped layer on the substrate, and
   growing the second doped layer on the metal pattern includes growing the second doped layer on the substrate.

10. The method according to claim 5, wherein forming the pn junction comprises:
    forming a first doped layer on the substrate; and
    growing a second doped layer on the metal pattern.

11. The method according to claim 10, wherein forming the pn junction further comprises:
    forming an intrinsic layer between the first doped layer and the second doped layer.

12. The method according to claim 10, wherein the first doped layer is made of amorphous silicon and is formed by a chemical vapor deposition (CVD) method.

13. The method according to claim 5, wherein forming the pn junction comprises:
   forming a first doped layer on the substrate;
   growing second doped layers on the substrate and the metal pattern, respectively; and
   growing another first doped layer on the metal pattern.

14. The method according to claim 13, wherein growing the other first doped layer on the metal pattern includes growing the other first doped layer on the substrate.

15. The method according to claim 13, wherein the first doped layer on the substrate is made of amorphous silicon and is formed by a CVD method.

16. The method according to claim 5, wherein forming the pn junction comprises:
   forming a first doped layer on the substrate;
   growing a second doped layer on the metal pattern;
   growing intrinsic layers on the substrate and the metal pattern, respectively;
   growing another first doped layer on the metal pattern; and
   forming another second doped layer on the substrate.

17. The method according to claim 16, wherein the first doped layer and the other second doped layer on the substrate are made of amorphous silicon and are formed by a CVD method.

18. The method according to claim 1, wherein the silicon film is formed to an equal thickness in all directions on the surface of the metal pattern.

* * * * *